(12) United States Patent
Trimberger

(10) Patent No.: US 7,482,954 B1
(45) Date of Patent: Jan. 27, 2009

(54) BITSTREAM COMPRESSION FOR A PROGRAMMABLE DEVICE

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 615 days.

(21) Appl. No.: 11/067,419

(22) Filed: Feb. 25, 2005

(51) Int. Cl.
*H03M 7/30* (2006.01)
(52) U.S. Cl. .......................... 341/87; 341/50
(58) Field of Classification Search .......... 341/50–90; 710/68
See application file for complete search history.

(56) References Cited

U.S. PATENT DOCUMENTS

| | | | |
|---|---|---|---|
| 3,490,690 A | 1/1970 | Little et al. | |
| 5,479,166 A * | 12/1995 | Read et al. | 341/65 |
| 5,563,592 A | 10/1996 | Cliff et al. | |
| 5,745,734 A | 4/1998 | Craft et al. | |
| 5,798,719 A * | 8/1998 | Wise et al. | 341/67 |
| 5,821,885 A * | 10/1998 | Wise et al. | 341/67 |
| 5,872,529 A * | 2/1999 | Mejia | 341/59 |
| 5,874,907 A | 2/1999 | Craft | |
| 5,963,154 A * | 10/1999 | Wise et al. | 341/67 |
| 6,493,862 B1 | 12/2002 | Young et al. | |
| 6,563,437 B1 * | 5/2003 | Landry et al. | 341/51 |
| 6,744,388 B1 | 6/2004 | Khu | |
| 7,043,079 B2 | 5/2006 | Malvar et al. | |
| 7,103,685 B1 * | 9/2006 | Trimberger | 710/68 |

| | | |
|---|---|---|
| 2005/0071566 A1 | 3/2005 | Asi-Tabatabai et al. |
| 2005/0160234 A1 | 7/2005 | Newburn et al. |

OTHER PUBLICATIONS

U.S. Appl. No. 10/407,280, filed Apr. 3, 2003, Sundararajan et al.
U.S. Appl. No. 10/759,755, filed Jan. 16, 2004, Trimberger.
Xilinx, Inc.; "Virtex Series Configuration Architecture User Guide," XAPP151, Sep. 27, 2000, pp. 1-45, v.1.5, available from Xilinx, Inc., 2100 Logic Drive, San Jose, CA 95124.
Brandenburg, K. et al.; "An Introduction to MPEG Layer-3," EBU Technical Review, Jun. 2000, pp. 1-15, available from EBU Technical Review, http://www.ebu.ch/trev_283-popp.pdf.
Li, Zhiyuan et al.; "Configuration Compression for Virtex FPGAs," IEEE Symposium on FPGAs for Custom Computing Machines, Jun. 2001, pp. 1-15, available from IEEE, 3 Park Avenue, 17th Floor, New York, NY 10016-5997.

* cited by examiner

*Primary Examiner*—Lam T Mai
(74) *Attorney, Agent, or Firm*—Robert M. Brush

(57) ABSTRACT

Method and apparatus for processing configuration data for a programmable logic device is described. The configuration data includes a sequence of frames. In one example, bits in the sequence of frames are identified as "don't care" bits that do not affect the functionality of a design implemented in the programmable logic device. Frames in the sequence of frames are compared to identify at least one set of identical frames, where the "don't care" bits are deemed to result in matches. Each of the at least one set of identical frames is merged to produce a respective at least one merged frame. Each of the at least one merged frame is associated with a plurality of configuration memory addresses in the programmable logic device. Each of the at least one merged frame may be loaded into configuration memory of the programmable logic device using a multi-frame write process.

20 Claims, 7 Drawing Sheets

BITSTREAM COMPRESSION FOR A PROGRAMMABLE DEVICE

FIELD OF THE INVENTION

One or more aspects of the present invention relate generally to the configuration of programmable logic devices and, more particularly, to bitstream compression for a programmable logic device.

BACKGROUND OF THE INVENTION

Conventional programmable logic devices, such a field programmable gate arrays (FPGAs), are configured in response to a configuration bitstream. The configuration bitstream is typically shifted into the programmable logic device, and then loaded into an array of configuration memory cells. The programmable logic device is configured in response to the contents of the configuration memory cells. An exemplary configuration process for an FPGA is described in "Virtex Series Configuration Architecture User Guide," Xilinx Application Note XAPP151 (Ver. 1.7), published October 2004.

In some cases, a configuration bitstream can include 20 million or more configuration data bits. As a result, a large external memory is required to store the configuration bitstream. In addition, it takes a relatively long time to load such a large bitstream. For example, it may take about 400 milliseconds to load a configuration bitstream having 20 million configuration data bits.

Normal compression algorithms may be used to reduce the required number of configuration data bits. One compression algorithm that has been used to compress configuration bitstreams is the Lempel-Ziv (LZ) compression algorithm. The LZ compression algorithm operates efficiently in applications where groups of symbols occur frequently. However, these compression algorithms typically only reduce the required number of configuration data bits by a factor of two. Moreover, use of such a compression scheme requires additional decompression logic either in the FPGA itself or coupled to the FPGA.

In some programmable logic devices, the configuration bitstream is divided into subsets called frames. Inside the programmable logic device, a complete frame is buffered and written into configuration memory cells at a frame address. In a typical configuration process, frame data is transmitted to the programmable logic device serially and when each frame has been completely received, configuration control logic writes the data to the next frame address location. Some programmable logic devices include a "multi-frame write" capability as part of the configuration logic. The multi-frame write capability permits the configuration logic to write the buffered frame bits to multiple addresses in its configuration memory. Thus, the configuration data stream includes the frame addresses for duplicate frames, rather than the duplicate frame data. This capability permits the configuration data to be compressed, but only if complete frames are identical (i.e., every bit of one frame has the same logic value of every corresponding bit in another frame). However, complete data frames are not often identical, since different parts of the programmable logic device perform different functions. As such, compression using multi-frame write provides only a small amount of data compression, if any.

Accordingly, there exists a need in the art for an improved bitstream compression technique for a programmable logic device that does not require additional decompression hardware.

SUMMARY OF THE INVENTION

Method and apparatus for processing configuration data for a programmable logic device is described. The configuration data includes a sequence of frames. In one embodiment, bits in the sequence of frames are identified as "don't care" bits that do not affect the functionality of a design implemented in the programmable logic device. Frames in the sequence of frames are compared to identify at least one set of identical frames, where the "don't care" bits are deemed to result in matches. Each of the at least one set of identical frames is merged to produce a respective at least one merged frame. Each of the at least one merged frame is associated with a plurality of configuration memory addresses in the programmable logic device. Each of the at least one merged frame may be loaded into configuration memory of the programmable logic device using a multi-frame write process.

In another embodiment, a set of nodes is defined. Each node in the set of nodes is associated with a frame in the sequence of frames, a mask that identifies the location of any "don't care" bits in the frame, and configuration memory address data associated with the programmable logic device. A graph is defined by computing arcs between respective pairs of nodes in the set of nodes. Each of the pairs is associated with identical frames after ignoring any "don't care" bits. The graph is processed to combine a portion of the set of nodes to produce a reduced set of nodes.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Bitstream compression for a programmable logic device is described. One or more aspects of the invention are described with respect to a field programmable gate array (FPGA). Those skilled in the art will appreciate that the invention may be used with other types of programmable logic devices, such as complex programmable logic devices (CPLDs).

Figure 1:
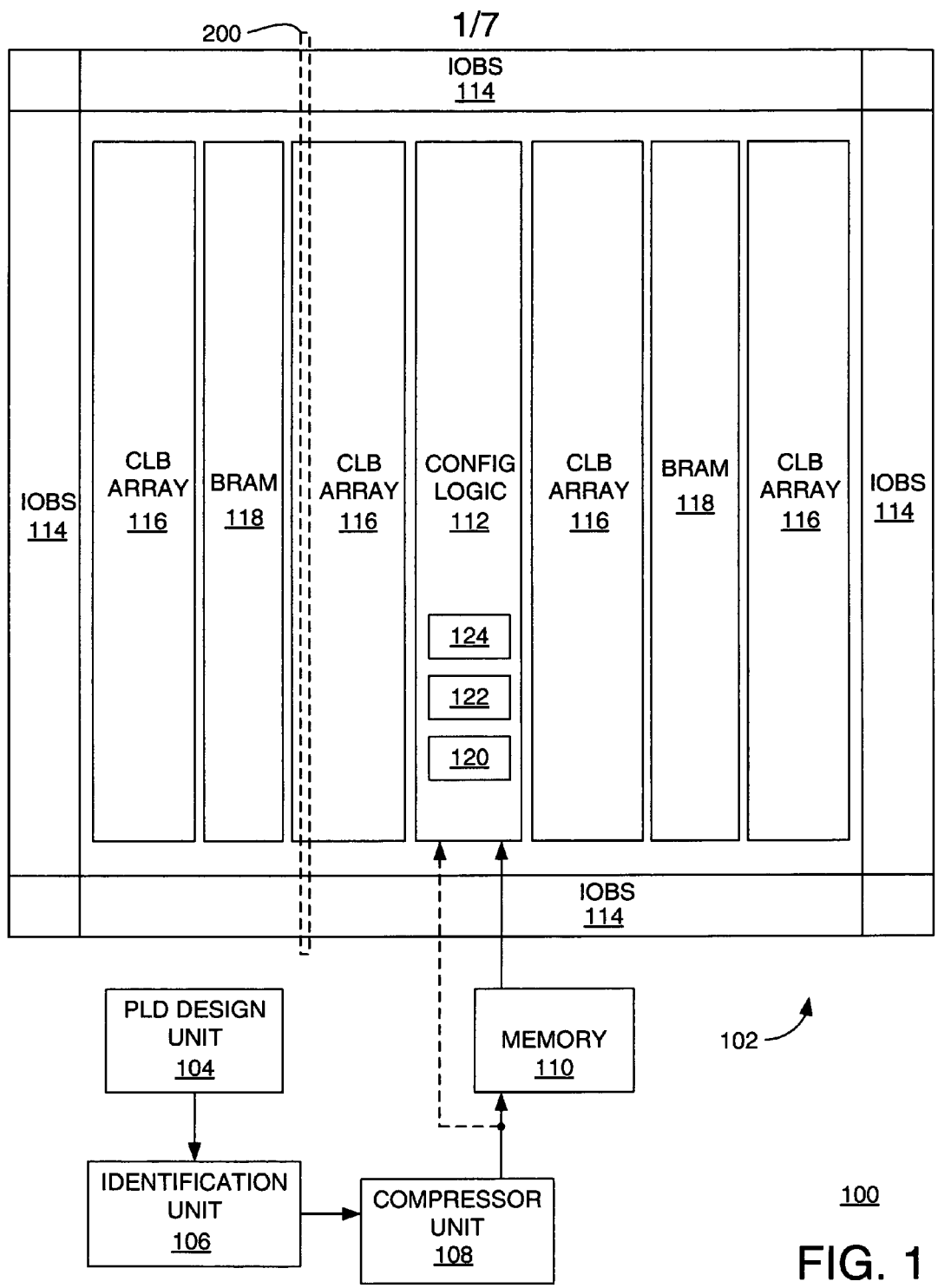
FIG. 1 is a block diagram depicting an exemplary embodiment of a programmable logic system constructed in accordance with the invention.

FIG. 1 is a block diagram depicting an exemplary embodiment of a programmable logic system 100 constructed in accordance with the invention. The programmable logic system 100 includes a programmable logic device (PLD) 102, a PLD design unit 104, an identification unit 106, a compressor unit 108, and a memory device 110. The desired configuration of the PLD 102 is determined by the PLD design unit 104. The PLD design unit 104 provides uncompressed configuration data (e.g., a configuration bitstream) for configuring the PLD 102 with a design. The identification unit 106 processes the uncompressed configuration data from the PLD design unit 104 to identify bits as "don't care" bits. As described below, "don't care" bits do not affect the functionality of the PLD 102. The identification unit 106 provides the uncompressed configuration data along with data indicative of the identified "don't care" bits. For example, methods for identifying "don't care" bits are described in U.S. patent application Ser. No. 10/407,280, filed Apr. 3, 2003, entitled "Methods of Estimating Susceptibility to Single Event Upsets for a Design Implemented in an FPGA," by Sundararajan et al., which is incorporated herein by reference.

The compressor unit 108 processes the output of the identification unit 106 to produce compressed configuration data. Operation of the compressor unit 108 is described in more detail below. In one embodiment, the compressed configuration data is stored in the memory device 110. The compressed configuration data may then be loaded into the PLD 102 from the memory device 110. Alternatively, the compressed configuration data may be loaded directly into the PLD 102 from the compressor unit 108.

In particular, the PLD 102 includes configuration logic 112, a plurality input/output blocks (IOBs) 114 located around the periphery of the device, an array of configurable logic blocks (CLBs) 116 arranged in rows and columns, and a plurality of block RAM (BRAM) elements 118 that extend along the column direction of the CLB array 116. The IOBs 114 also may be distributed in columns (not shown). Clock resources and a programmable routing structure (not shown) are also located on the PLD 102. Those skilled in the art will appreciate that the PLD 102 may include other types of logic blocks and circuits in addition to those described herein. For example, the PLD 102 may include an embedded microprocessor, digital lock loop (DLL) circuits, input/output (I/O) transceivers, and the like. The above-described elements of the PLD 102 can be found in a VIRTEX-II FPGA, which is commercially available from Xilinx, Inc. of San Jose, Calif., and like-type devices.

The configuration logic 112 includes address register logic 120, data register logic 122, and command register logic 124. An associated configuration memory array (portion shown in FIG. 2) is loaded with configuration data values, which configure the above-described elements of the PLD 102. The configuration data values are loaded into the configuration memory array via the configuration logic 112 in the manner described below.

Figure 2:
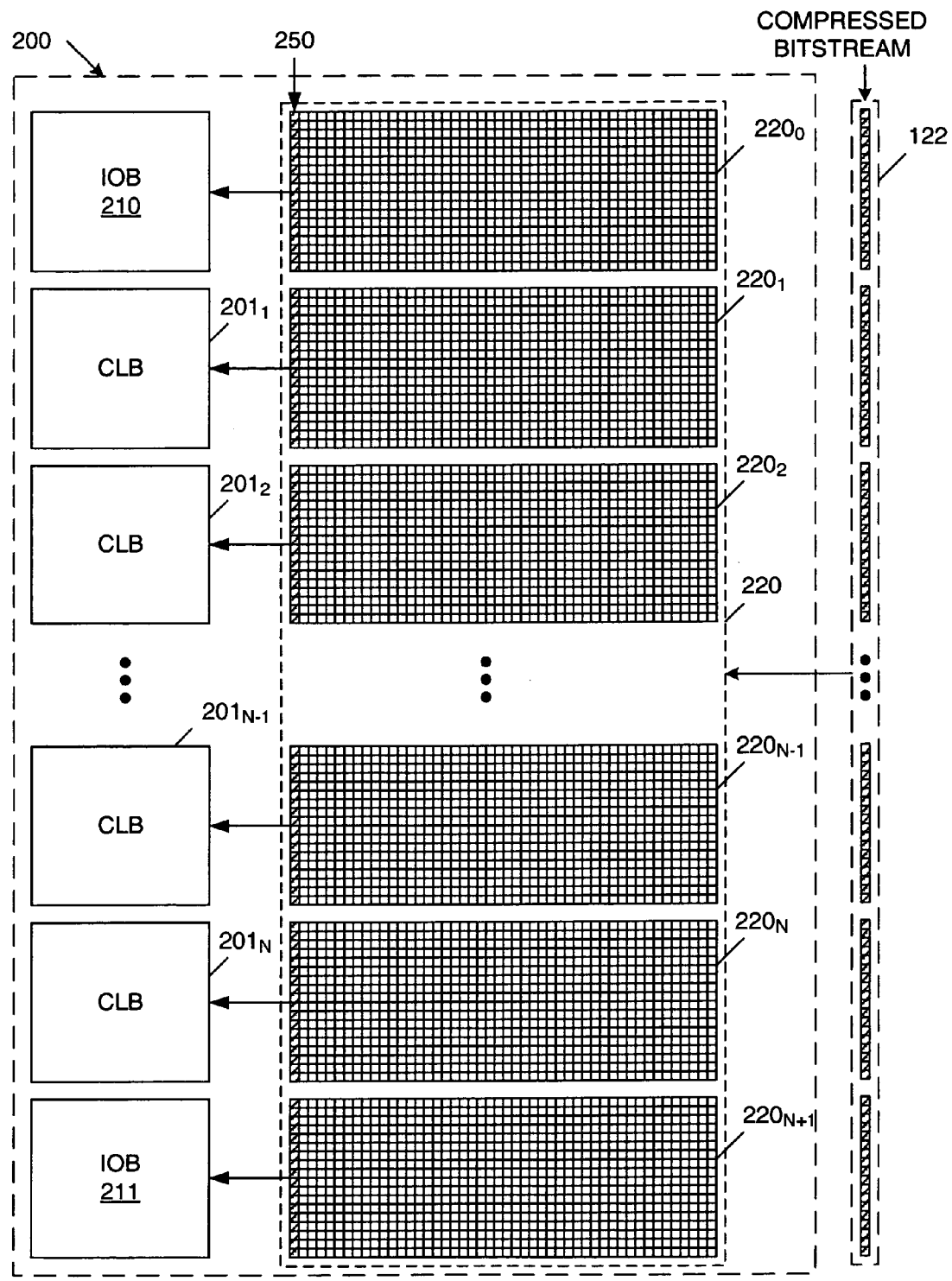
FIG. 2 is a block diagram depicting an exemplary embodiment of data register logic and a section of the programmable logic device of FIG. 1.

FIG. 2 is a block diagram depicting an exemplary embodiment of the data register logic 122 and a section 200 of the programmable logic device 102. The section 200 includes a column of CLBs $201_1$-$201_N$, a top IOB 210, a bottom IOB 211, and the configuration memory array section 220 associated with the CLBs $201_1$-$201_N$ and the IOBs 210-211. The section 200 is illustrated in dashed lines in FIG. 1. The configuration memory array section 220 includes a plurality of configuration memory array subsections $220_0$-$220_{N+1}$.

For purposes of clarity by example, each configuration memory array subsection is shown as including 18 rows and 48 columns of configuration memory cells, wherein each configuration memory cell stores a corresponding configuration bit. Each of the configuration memory array subsections $220_0$-$220_{N+1}$ configures an associated IOB or CLB as illustrated. It is to be understood that other dimensions are possible for the configuration memory array subsections $220_0$-$220_{N+1}$. Further, IOBs and other programmable structures may require different numbers of configuration memory bits. As such, the subsection of the configuration memory array corresponding to each different type of programmable resource may have different dimensions. Although memory cells are shown separate from the CLB and IOB logic, configuration memory cells may be physically distributed within the logic of the programmable resources, yet retain their structure of rows and columns.

The configuration memory array section 220 is loaded on a column-by-column basis. An entire column of configuration data bits (hereinafter referred to as a frame of configuration data bits) includes 18×(N+2) bits. One frame of configuration data bits is illustrated by shaded column 250.

With reference to FIGS. 1 and 2, to load a set of data frames into the configuration memory array, the address register logic 120 is loaded with an address for the first frame. A write command is then loaded into the command register logic 124. In response, configuration data bits are shifted into the data register logic 122, until the data register logic 122 stores a frame of configuration data bits. The frame of configuration data bits is then simultaneously written into a frame of the configuration memory array having the address stored in the address register logic 120 (e.g., the column 250 of the configuration memory array section 220). The address in the address register logic 120 is incremented and the process is repeated until the entire configuration memory array is loaded with the desired configuration memory bits.

During the configuration process, the command register logic 124 may be loaded with a multi-frame write command. In this case, a single bit pattern stored in the data register logic 122 is written into multiple frames (columns) of the configuration memory array in accordance with address values stored in the address register logic 120. This is in contrast to a write command, where the bit pattern stored in the data register logic 122 is written into a single frame (column) and then a new bit pattern is loaded into the data register logic 122.

Returning to FIG. 1, the identification unit 106 identifies all of the "don't care" bits in the uncompressed configuration bitstream provided by the PLD design unit 104. These "Don't Care" bits are defined as the bits in the uncompressed configuration bitstream that can have either a logic "0" value or a logic "1" value without affecting the functionality of the PLD design. That is, a design will function as intended regardless of the states the "don't care" bits. Conversely, "care" bits can be defined as configuration bits that do affect functionality.

The "don't care" bits can be identified as follows. In general, there are two groups of "don't care" bits, including, architectural "don't care" bits and design "don't care" bits. The architectural "don't care" bits are always "don't care" bits, regardless of the design configured in the PLD 102. Conversely, the design "don't care" bits are specific to the particular design configured in the PLD 102.

A first type of architectural "don't care" bit exists because certain locations of the configuration memory array are unused. That is, while the configuration memory array is fabricated as a full array of configuration memory cells, certain ones of these memory cells are not used in the configuration of the PLD 102. These unused configuration memory cells are not coupled to any other elements within the PLD 102. These unused configuration memory cells are only included in the configuration memory array because it is easier to fabricate a full array than omit selected memory cells from the full array. That is, it is easier to fabricate a memory cell array having a regular pattern, than a memory cell array having an irregular pattern. Moreover, a full array causes all of the frames to have the same size. The unused configuration memory cells have fixed locations within the configuration memory array, and are therefore easy to locate within the configuration bitstream. Furthermore, architectural "don't care" memory cells may arise because the number of memory cells required to define the function of the CLB is less than the product of the number of bits in the CLB's part of the frame times the number of frames that the CLB spans. As a result, some memory cells may not even be implemented, even though they are required to be sent to the PLD 102 in order to make all frames the same size, which simplifies the configuration logic. Approximately one to five percent of the configuration memory cells in a configuration memory array are typically unused in any given programmable logic device.

A second type of architectural "don't care" bit exists because many multiplexers of the PLD 102 are typically not fully encoded. Thus, there are "don't care" bits associated with unused portions of these multiplexers. Those skilled in the art will appreciate that other sources of architectural "don't care" bits are also possible.

A first type of design "don't care" bit includes those configuration bits associated with unused logic of the PLD 102. For example, multiplexers associated with unconnected interconnect structures not used in the design represent "don't care" bits. Similarly, multiplexers associated with unused CLB inputs or outputs represent "don't care" bits. In addition, multiplexers associated with unused IOB inputs or outputs also represent "don't care" bits. Configuration bits associated with unused CLBs in the CLB array 116 represent "don't care" bits. Similarly, configuration bits associated with unused portions of look-up tables (LUTs) in used CLBs that implement functions of less than four inputs represent "don't care" bits. In addition, the contents of the BRAM 118 that are not used (or are initially irrelevant) represent design "don't care" bits. Those skilled in the art will appreciate that other sources of design "don't care" bits are also possible.

Upon identifying the "don't care" bits, the identification unit 106 generates a configuration bitstream in which "don't care" configuration bits are identified. The uncompressed configuration bitstream is logically divided into frames corresponding to frames in the configuration memory array. The identification unit 106 provides an associated "don't care" mask for each of the frames. The "don't care" mask includes a bit for each bit of its corresponding frame (e.g., if the frame includes 18×(N+2) bits, the "don't care" mask includes the same number of bits). For example, a frame (D) beginning with "1101XXX" (where X denotes a "don't care" bit) has an associated mask (M) beginning with "0000111". In the described embodiments, a logic "1" in the mask identifies a "don't care" configuration bit, and a logic "0" the mask identifies a "care" bit. Thus, the mask (M) identifies three "don't care" configuration bits at the last three bit locations of configuration word (D). In other embodiments, the reverse logic can be used to identify the "don't care" bits.

The compressor unit 108 receives a stream of configuration frames along with the associated "don't care" masks. The compressor unit 108 performs a compression operation that merges identical frames in the configuration data into merged frames, which can be written into multiple frame address in the configuration memory array using the multi-frame write process. Frames are deemed to be "identical" if their bit patterns match after ignoring the "don't care" bits (i.e., the "don't care" bits are deemed to result in matches). For example, the bit pattern "1101 XXX" (where X denotes a "don't care" bit) would be deemed identical with the bit pattern "X10111X". The compressor unit 108 generates a compressed stream of configuration frames having one or more merged frames.

In one embodiment, the compressed configuration data is stored in the memory device 110. The memory device 110 may be, for example, a non-volatile FLASH memory. The compressed configuration data stored in the memory device 110 is subsequently coupled to the configuration logic 112 of the PLD 102, which loads the configuration data into the configuration memory array. Notably, merged frames in the configuration data are loaded using the multi-frame write process. In another embodiment, the compressed configuration data are provided directly to the configuration logic 112 of the PLD 102 from the compressor unit 108.

Figure 3:
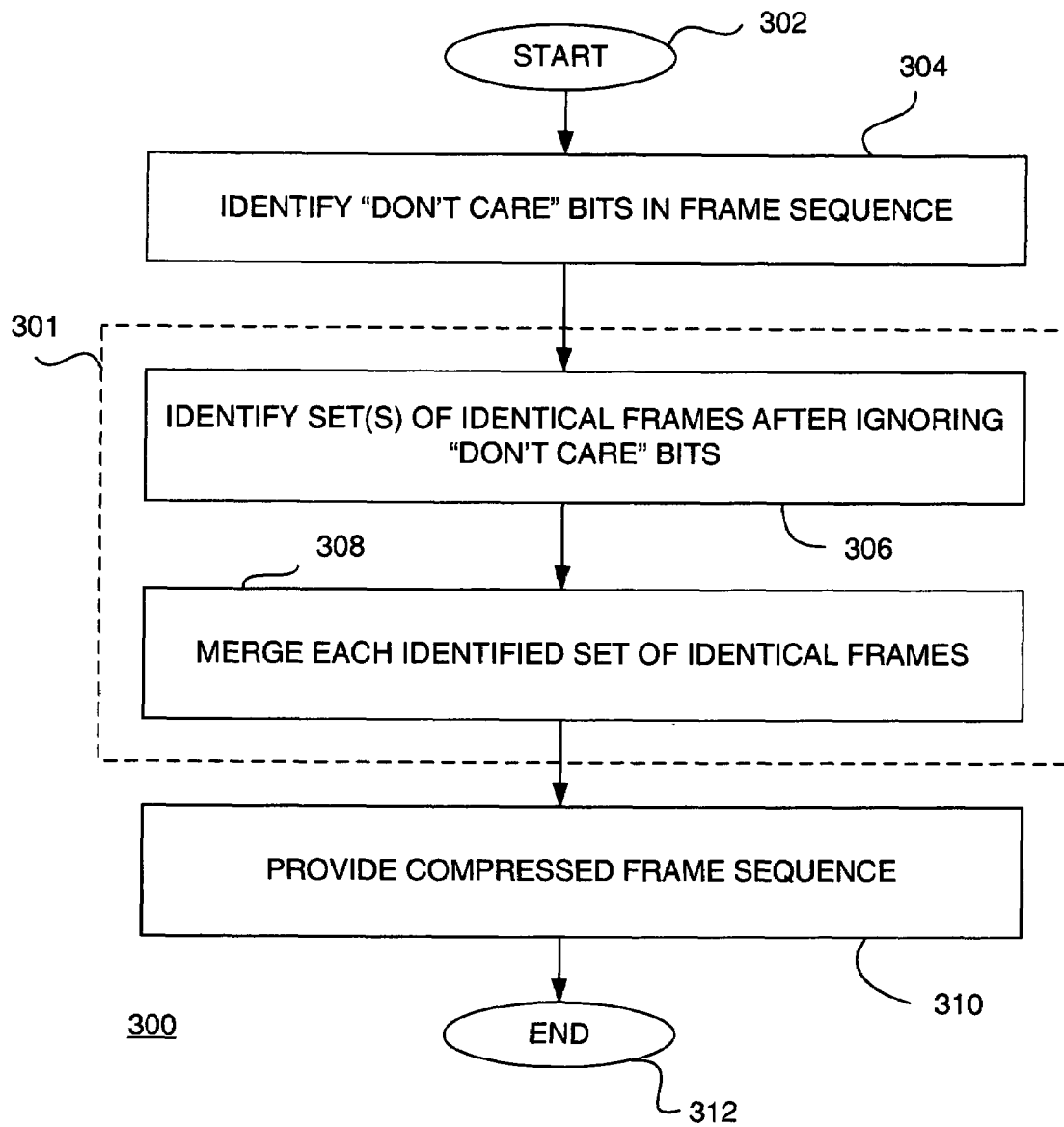
FIG. 3 is a flow diagram depicting an exemplary embodiment of a method for processing configuration data for a PLD in accordance with the invention.

FIG. 3 is a flow diagram depicting an exemplary embodiment of a method 300 for processing configuration data for a PLD in accordance with the invention. The method 300 begins at step 302. At step 304, bits in a sequence of frames comprising the configuration data are identified as "don't care" bits that do not affect the functionality of the PLD. A compression method 301 is then performed. In particular, at step 306, one or more sets of identical frames in the frame sequence are identified after ignoring the "don't care" bits. In other words, when the bit patterns of two frames are compared, the "don't care" bits are deemed to result in matches. A set of identical frames may comprise two or more frames.

At step 308, each identified set of identical frames is merged to produce a merged frame. Notably, each frame in the frame sequence of the uncompressed configuration data is associated with a configuration memory address in the PLD. When two or more identical frames are merged, the configuration memory addresses of the two or more identical frames are associated with the resulting merged frame. Thus, a given merged frame includes a single bit pattern associated with a plurality of configuration memory addresses in the PLD. At step 310, compressed configuration data is provided comprising one or more merged frames. The method 300 ends at step 312.

Figure 4:
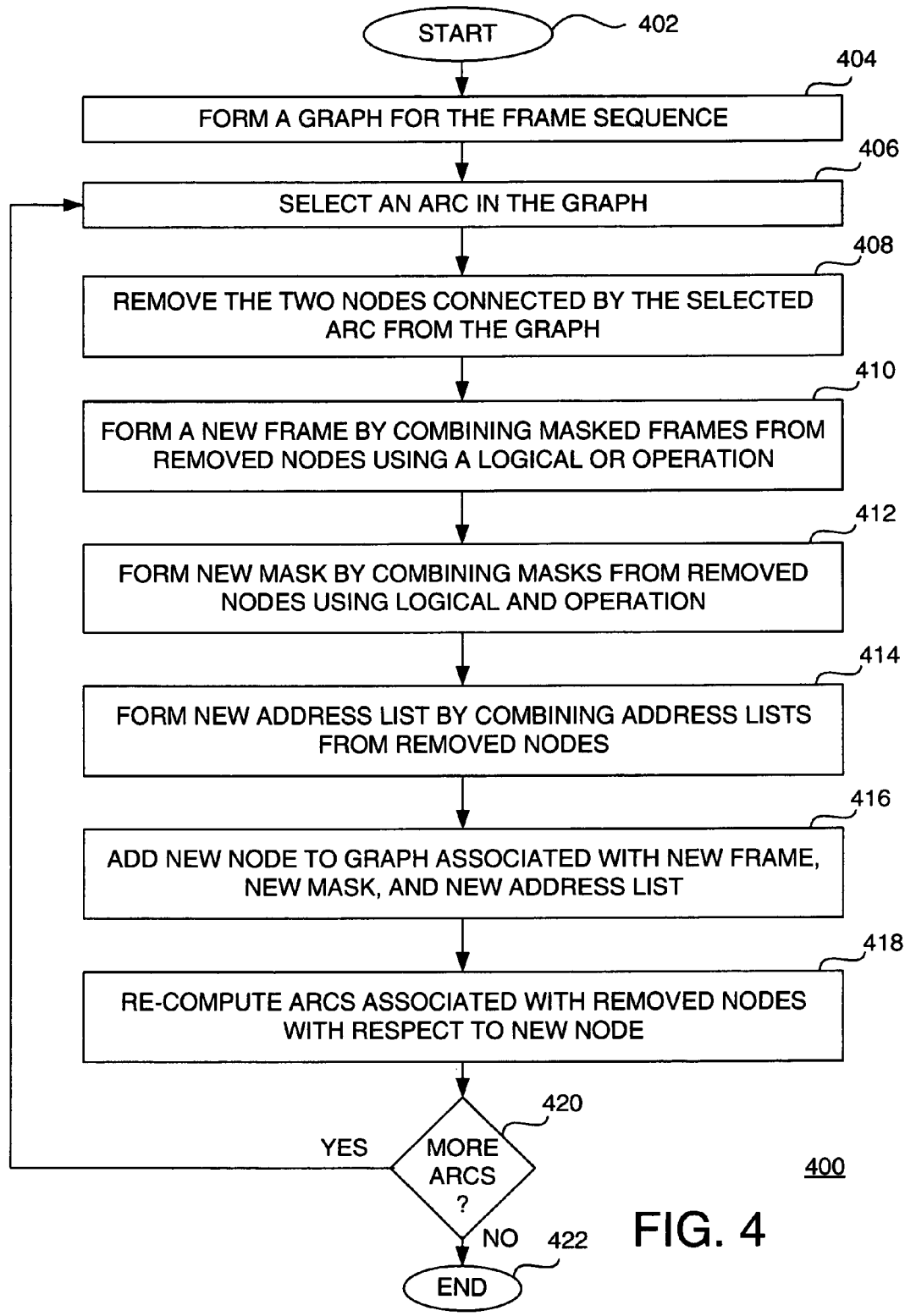
FIG. 4 is a flow diagram depicting an exemplary embodiment of a method for compressing a configuration frame sequence in accordance with the invention.

FIG. 4 is a flow diagram depicting an exemplary embodiment of a method 400 for compressing a configuration frame sequence in accordance with the invention. The method 400 may be used as the method 301 in FIG. 3. The method 400 begins at step 402. At step 404, a graph is formed for the configuration frame sequence. Notably, a set of nodes is defined in accordance with the frame sequence. Each node is associated with a frame in the sequence, a "don't care" mask that identifies the location of any "don't care" bits in the frame, and an address list. The address list includes one or more configuration memory addresses where the frame is to be written. Initially, the address list in each of the nodes includes a single address. As a result of the compression process described below, the address list of a given node may include a plurality of addresses.

The graph is formed by computing arcs between pairs of nodes. An arc exists between two nodes if the frames associated with the two nodes are identical after ignoring any "don't care" bits. Let frame(i) denote the bits of a first frame, dcmask (i) denote the "don't care" bits in frame(i) (where a logic "1" denotes a "don't care" bit and a logic "0" denotes a "care" bit), and address_list(i) denote the address(es) where frame(i) is to be written. Let frame(j), dcmask(j), and address_list(j) denote the same for a second frame. An arc exists between two nodes if:

$$(\text{frame}(i)\&!\text{dcmask}(i))\&!\text{dcmask}(j)=(\text{frame}(j)\&!\text{dcmask}(j))\&!\text{dcmask}(i) \qquad \text{Eq.1}$$

where "&" denotes a logical AND operation and "!" denotes a logical NOT operation.

At step 406, an arc is selected in the graph. At step 408, the two nodes connected by the selected arc are removed from the graph. At step 410, a new frame is formed by combining masked frames from the removed nodes using a logical OR operation. Continuing the example above, the new frame, frame(new), is computed as follows:

$$\text{frame(new)} = (\text{frame}(i) \& !dc\text{mask}(i)) | (\text{frame}(j) \& !dc\text{mask}(j)) \quad \text{Eq. 2,}$$

where "|" denotes a logical OR operation. At step 412, a new mask is formed by combining the masks from the removed nodes using a logical AND operation. Continuation the above example, the new mask, dcmask(new), is computed as follows:

$$dc\text{mask(new)} = dc\text{mask}(i) \& dc\text{mask}(j) \quad \text{Eq. 3.}$$

At step 414, a new address list is formed by combining address lists from the removed nodes. That is, address_list (new) equals address_list(i) merged with addresslist(j).

At step 416, a new node associated with the new frame, the new mask, and the new address list is added to the graph. At step 418, any arcs associated with the removed nodes (other than the selected arc) are re-computed with respect to the new node. For example, the node associated with frame(i) may have had arc to another node associated with a frame(k). A determination is made whether an arc should exist between the new node and the node associated with frame(k) using the equation discussed above. In some cases, the frame(new) may no longer be identical to frame(k) ignoring "don't care" bits and thus the arc must be removed. In other cases, the frame (new) may be identical ignoring "don't care" bits to frame(k) and thus the arc is not removed.

At step 420, a determination is made whether there are more arcs in the graph to be processed. If so, the method 400 returns to step 406. Otherwise, the method 400 ends at step 422. Note that, previously merged frames may be merged again in the method 400. In one embodiment of the invention, an arc is selected at step 406 such that, when the pair of nodes associated therewith is removed from the graph, the fewest "don't care" bits are eliminated from the bit pattern of the new frame. It is advantageous to form a new frame with the maximum number of "don't care" bits so that the new frame may be merged with still other frames (i.e., the more "don't care" bits in a frame, the easier it is to find other matching frames).

Figure 5:
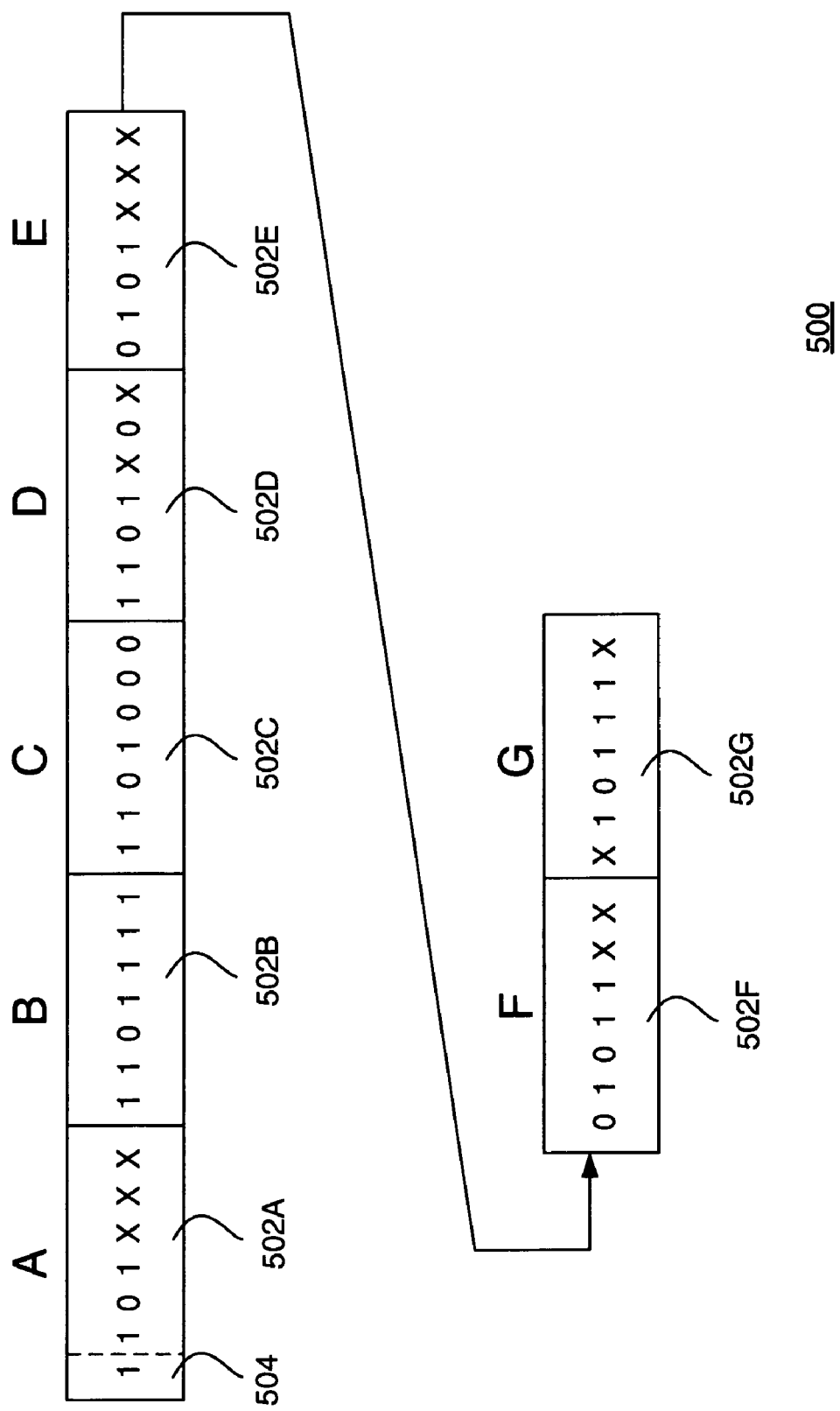
FIG. 5 is a block diagram depicting an illustrative configuration frame sequence having identified "don't care" bits.

The compression process of the invention may be further understood with reference to the following example. FIG. 5 is a block diagram depicting an illustrative configuration frame sequence 500 having identified "don't care" bits. The configuration frame sequence 500 comprises seven frames 502A through 502G (collectively referred to as frames 502). Each of the frames 502 includes seven bit locations 504 (i.e., each frame comprises a 7-bit pattern). Each of the bit locations 504 is assigned a bit value (i.e., a logic "1" or a logic "0") or a "don't care" value (denoted by an "X"). For example, the frame 502A includes the bit pattern "1101 XXX". Although the configuration frame sequence 500 is shown as including seven 7-bit frames, those skilled in the art will appreciate that a typical configuration stream for a PLD includes many more frames, each of which includes many more bits.

It is to be understood that the bit locations in the configuration frame sequence 500 having an "X" actually include a bit value (i.e., a logic "1" or a logic "0"), which may be arbitrary. As described above, the "don't care" bit locations are identified using masks for each of the frames. Each of the frames 502A through 502G includes a mask $M_A$ through $M_G$. In each mask, a logic "1" denotes a "don't care" bit and a logic "0" denotes a "care" bit. For example, the frame 502A may actually include the bit pattern "1101011" and be associated with a mask ($M_A$) having a value of "0000111". For purposes of clarity in the present example, the actual values of the "don't care" bits in the frames 502 are replaced with an "X".

Figure 6:
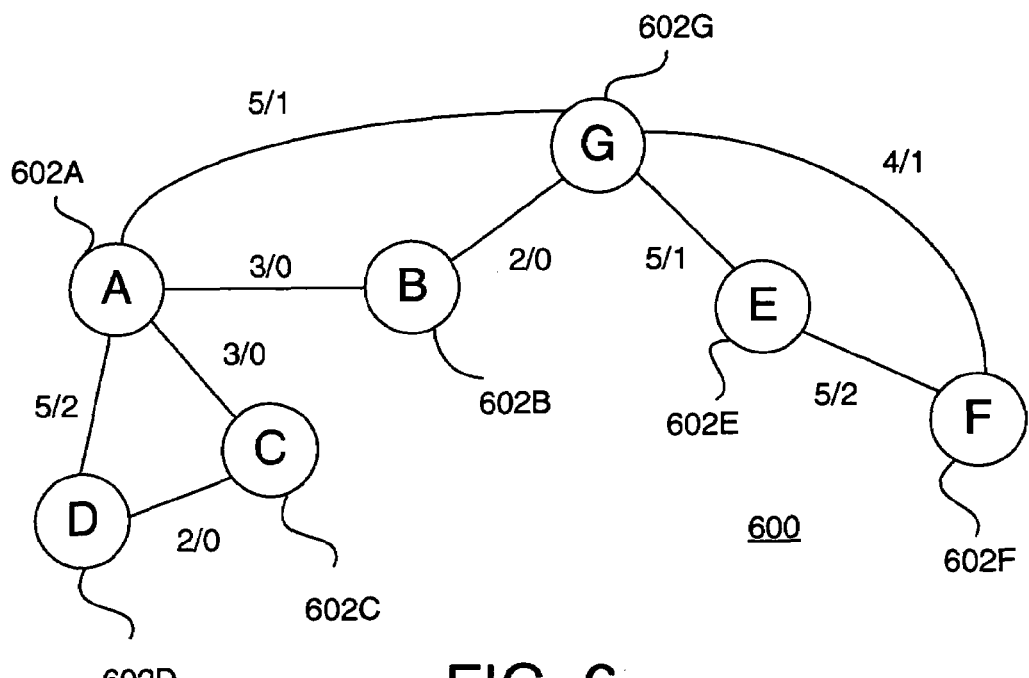
FIGS. 6-8 depict views of a graph formed in response to the configuration frame sequence of FIG. 5.

FIG. 6 depicts a view 600 of a graph formed in response to the configuration frame sequence 500. In the view 600, the graph includes nodes 602A through 602G (collectively referred to as nodes 602) corresponding to the frames 502A through 502G, respectively. For clarity, the frames 502A through 502G are referred to as frames A through G. As described above, an arc 604 between two of the nodes 602 denotes that the frames associated therewith are identical ignoring any "don't care" bits. In the present example, ignoring any "don't care" bits, frame A is identical to frames B, C, D, and G; frame D is identical to frame C; frame G is identical to frames B, E, and F; and frame E is identical to frame F.

Each of the arcs 604 includes a label M/N, where M denotes the total number of "don't care" bits between the frames of the corresponding nodes, and N denotes the number of "don't care" bits that would be present if the two corresponding nodes were merged. For example, the frames A and G together include five "don't care" bits, and a merged frame resulting from merger of the nodes A and G would include one "don't care" bit.

An arc is selected for compression based on its M/N label. The arc between nodes 602A and 602D, and the arc between nodes 602E and 602F, are selected for compression first, since the nodes resulting from their mergers would each include two "don't care" bits. Other mergers would result in only one or zero "don't care" bits.

Figure 7:
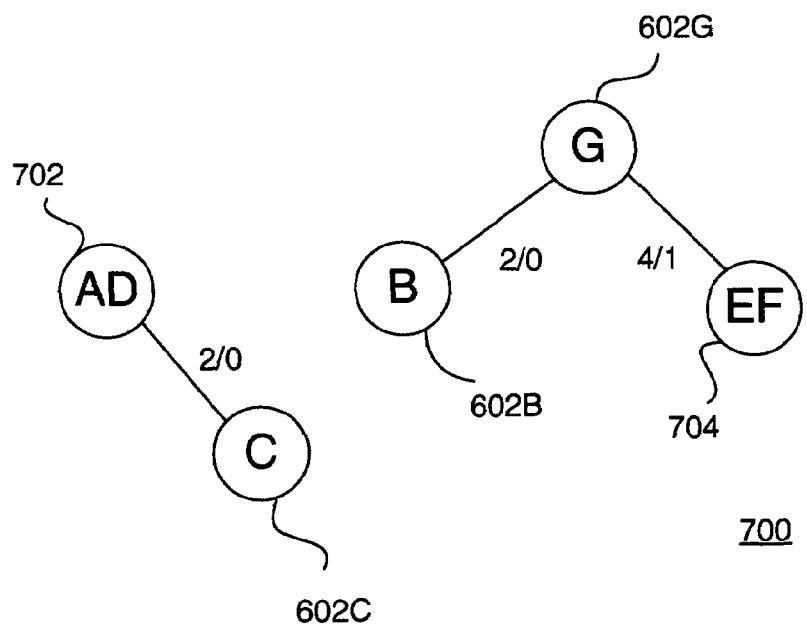

FIG. 7 depicts a view 700 of the graph after the nodes 602A and 602D, and the nodes 602E and 602F, have been merged. The graph includes new nodes 702 (node AD) and 704 (node EF). The merged frame resulting from the merger between nodes 602A and 602D is as follows (using Eq. 2):

new frame=(frame A&!$M_A$)|(frame D&!$M_D$)=
(1101XXX&1111000)|(1101X0X&1111010)
=1101000.

The mask for the new frame becomes:

new mask=$M_A$&$M_D$=00000111&0000101=0000101.

Thus, the new frame in combination with the new mask may be denoted as "1101X0X", since the third to last and the last bit of the new frame are "don't care" bits. The node 602A had arcs to the nodes 602G, 602B, and 602C. The node 602D had an arc to node 602C. After re-computation, the new node 702 includes only the arc to the node 602C. The frame associated with the node AD is not deemed identical to the frames associated with the nodes B and G.

The merged frame resulting from the merger between nodes 602E and 602F is as follows (using Eq. 2):

new frame=(frame E&!$M_E$)|(frame F&!$M_F$)=
(0101XXX&1111000)|(01011XX&1111100)
=0101100.

The mask for the new frame becomes:

new mask=$M_E$&$M_F$=0000111&0000011=0000011.

Thus, the new frame in combination with the new mask may be denoted as "01011 XX", since the second to last and the last bit of the new frame are "don't care" bits. The node 602E had an arc to the node 602G. The node 602F had an arc to the node 602G. After re-computation, the new node 704 includes only an arc to the node 602G.

The arc between nodes 702 and 602C, and the arc between nodes 602G and 704, are selected for compression next. Note that there is no other arc to choose between the nodes 702 and 602C. The arc between the nodes 602G and 704 is chosen, since the resulting merger will include one "don't care" bit as opposed to no "don't care" bits.

Figure 8:
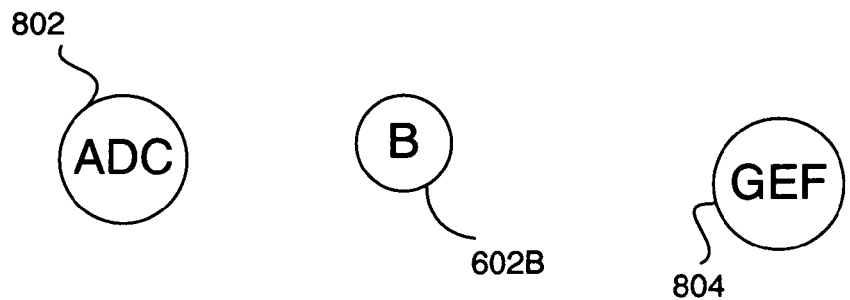

FIG. 8 depicts a view 800 of the graph after the next merger. The graph includes new nodes 802 (node ADC) and 804 (node GEF). The merged frame resulting from the merger between nodes 702 and 602C is as follows (using Eq. 2):

new frame=(frame AD&!$M_{AD}$)|(frame C&!$M_C$)=
(1101X0X&1111010)|(1101000&1111111)
=1101000.

The mask for the new frame becomes:

new mask=$M_{AD}$&$M_C$=0000101&0000000=0000000.

Thus, the new frame in combination with the new mask may be denoted as "1101000", as there are no "don't care" bits. There were no other arcs going to either the node 702 or the node 602C and thus no re-computation of arcs is necessary.

The merged frame resulting from the merger between nodes 704 and 602G is as follows (using Eq. 2):

new frame=(frame EF&!$M_{EF}$)|(frame G&!$M_G$)=
(01011XX&1111100)|(X10111x&0111110)
=0101110.

The mask for the new frame becomes:

new mask=$M_{EF}$&$M_G$=0000011&1000001=0000001.

Thus, the new frame in combination with the new mask may be denoted as "010111 X", since the last bit of the new frame is a "don't care" bit. The node 704 had an arc to the node 602B. After re-computation, there is no arc between the node 804 and the node 602B, since the frames associated therewith are not deemed identical (i.e., the first bit of the frame B is a logic "1" and the first bit of the frame GEF is a logic "0").

Therefore, the compressed configuration frame sequence includes three frames: a merged frame from frames A, D, and C; frame B; and a merged frame from frames G, E, and F. Thus, the configuration frame sequence 500 was compressed from seven frames down to three frames. The merged frame ADC includes the addresses for each of the frames A, D, and C. The merged from GEF includes addresses for each of the frames G, E, and F. The merged frames are written to the configuration memory array using a multi-frame write process, as described above.

Figure 9:
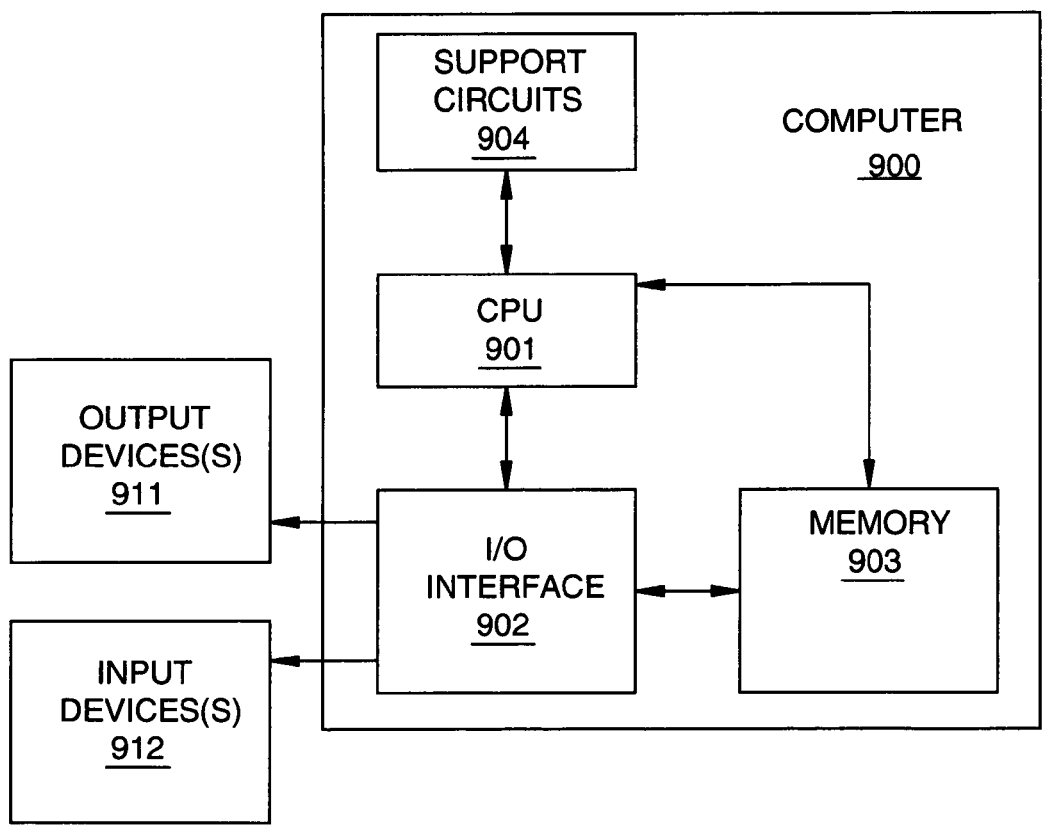
FIG. 9 is a block diagram depicting an exemplary embodiment of a computer suitable for implementing the processes and methods described herein.

FIG. 9 is a block diagram depicting an exemplary embodiment of a computer 900 suitable for implementing the processes and methods described herein. For example, the computer 900 may be used to implement the PLD design unit 104, the identification unit 106, and the compressor unit 108, as well as to perform the processes 300 and 400. The computer 900 includes a processor 901, a memory 903, various support circuits 904, and an I/O interface 902. The processor 901 may be any type of microprocessor known in the art. The support circuits 904 for the processor 901 include conventional cache, power supplies, clock circuits, data registers, I/O interfaces, and the like. The I/O interface 902 may be directly coupled to the memory 903 or coupled through the processor 901. The I/O interface 902 may be coupled to various input devices 412 and output devices 911, such as a conventional keyboard, mouse, printer, display, and the like.

The memory 903 stores all or portions of one or more programs and/or data to implement the PLD design unit 104, the identification unit 106, and the compressor unit 108, as well as to perform the processes 300 and 400. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 900 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 903. The memory 903 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product or computer readable medium for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

I claim:

1. A method of processing configuration data for a programmable device, the configuration data having a sequence of frames, the method comprising:
   identifying bits in the sequence of frames as "don't care" bits that do not affect functionality of a design implemented in the programmable logic device;
   comparing frames in the sequence of frames to identify at least one set of identical frame, where the "don't care" bits are deemed to result in matches; and
   merging each of the at least one set of identical frames to produce a respective at least one merged frame, each of the at least merged frame being associated with a plurality of configuration memory addresses in the programmable device.

2. The method of claim 1, further comprising:
   providing a compressed sequence of frames having the at least one merged frame and a portion of the sequence of frames.

3. The method of claim 2, further comprising:
   loading the compressed sequence of frames into configuration memory of the programmable device, each of the at least one merged frame being written to the plurality of configuration memory addresses associated therewith.

4. The method of claim 3, wherein the programmable device comprises a field programmable gate array, and wherein each of the at least one merged frame is written to the configuration memory using a multi-frame write process.

5. The method of claim 1, wherein the "don't care" bits comprise at least one of: architectural "don't care" bits of the programmable device, design "don't care" bits of the programmable device, and bits associated with unused logic in the programmable device.

6. The method of claim 1, wherein the steps of identifying, comparing, and merging are performed by a computer system external to the programmable device.

7. A method of processing configuration data for a programmable device, the configuration data having a sequence of frames, the method comprising:
  defining a set of nodes, each node in the set of nodes being associated with a frame in the sequence of frames, a mask that identifies the location of any "don't care" bits in the frame, and configuration memory address data associated with the programmable device;
  defining a graph by computing arcs between respective pairs of nodes in the set of nodes, each of the pairs being associated with identical frames after ignoring any "don't care" bits; and
  processing the graph to combine a portion of the set of nodes to produce a reduced set of nodes.

8. The method of claim 7, further comprising:
  providing a compressed sequence of frames in accordance with the reduced set of nodes.

9. The method of claim 7, wherein the step of processing comprises:
  (a) selecting an arc of the arcs;
  (b) removing a first node and a second node in the pair of nodes associated with the selected arc from the graph;
  (c) forming a new frame from the identical frames associated with the first node and the second node, the mask associated with the first node, and the mask associated with the second node;
  (d) forming a new mask from the mask associated with the first node and the mask associated with the second node;
  (e) forming new configuration memory address data from the configuration memory address data associated with the first node and the configuration memory address data associated with the second node; and
  (f) adding a new node associated with the new frame, the new mask, and the new configuration memory address data to the graph.

10. The method of claim 9, wherein the step of processing further comprises:
  (g) re-computing any other of the arcs associated with the first node or the second node with respect to the new node.

11. The method of claim 10, further comprising:
  selecting at least one additional arc of the arcs; and
  repeating steps (b) through (g) for the at least one additional selected arc.

12. The method of claim 9, wherein the selected arc is chosen such that, when the pair of nodes associated with the selected arc are removed form the graph, the fewest "don't care" bits are eliminated from the new frame.

13. Apparatus for processing configuration data for a programmable device, the configuration data having a sequence of frames, the apparatus comprising:
  an identification unit identifying bits in the sequence of frames as "don't care" bits that do not affect functionality of a design implemented in the programmable device; and
  a compressor unit for comparing frames in the sequence of frames to identify at least one set of identical frames, where the "don't care" bits are deemed to result in matches, and merging each of the at least one set of identical frames to produce a respective at least one merged frame, each of the at least merged frame being associated with a plurality of configuration memory addresses in the programmable device.

14. The apparatus of claim 13, further comprising:
  a memory for storing a compressed sequence of frames having the at least one merged frame and a portion of the sequence of frames.

15. The apparatus of claim 14, wherein the memory is coupled to the programmable device for loading the compressed sequence of frames into configuration memory of the programmable device, each of the at least one merged frame being written to the plurality of configuration memory addresses associated therewith.

16. The apparatus of claim 15, wherein the programmable device comprises a field programmable gate array (FPGA), and wherein the FPGA is configured to write each of the at least one merged frame to the configuration memory using a multi-frame write process.

17. The apparatus of claim 13, wherein the compressor unit is coupled to the programmable device for loading the compressed sequence of frames into configuration memory of the programmable device, each of the at least one merged frame being written to the plurality of configuration memory addresses associated therewith.

18. The apparatus of claim 17, wherein the programmable device comprises a field programmable gate array (FPGA), and wherein the FPGA is configured to write each of the at least one merged frame to the configuration memory using a multi-frame write process.

19. The apparatus of claim 13, wherein the "don't care" bits comprise at least one of: architectural "don't care" bits of the programmable device, design "don't care" bits of the programmable device, and bits associated with unused logic in the programmable device.

20. The apparatus of claim 13, wherein the identification unit and the compressor unit comprise a portion of a computer system.

* * * * *